United States Patent [19]

Yan et al.

[11] Patent Number: 5,519,248
[45] Date of Patent: *May 21, 1996

[54] CIRCUITS FOR ESD PROTECTION OF METAL-TO-METAL ANTIFUSES DURING PROCESSING

[75] Inventors: Yeouchung Yan, San Jose; Wenn-Jei Chen, Sunnyvale; Steve S. Chiang, Saratoga; Abdul R. Forouhi, San Jose, all of Calif.

[73] Assignee: Actel Corporation, Sunnyvale, Calif.

[*] Notice: the term of this patent shall not extend beyond the expiration date of Pat. No. 5,369,054.

[21] Appl. No.: 277,673

[22] Filed: Jul. 19, 1994

Related U.S. Application Data

[63] Continuation of Ser. No. 87,942, Jul. 7, 1993, Pat. No. 5,369,054.

[51] Int. Cl.$^6$ ............................................. H01L 29/00
[52] U.S. Cl. .......................... 257/530; 257/50; 257/355
[58] Field of Search ............................ 257/530, 50, 355

[56] References Cited

U.S. PATENT DOCUMENTS

| | | | |
|---|---|---|---|
| 4,420,820 | 12/1983 | Preedy | 365/105 |
| 4,599,705 | 7/1986 | Holmberg et al. | 257/530 |
| 4,651,409 | 3/1987 | Ellsworth et al. | 29/576 |
| 4,748,490 | 5/1988 | Hollingsworth | 357/51 |
| 4,751,197 | 6/1988 | Wills | 437/174 |
| 4,796,075 | 1/1989 | Whitten | 357/51 |
| 4,821,096 | 4/1989 | Mahcney . | |
| 4,822,753 | 4/1989 | Pintchovski et al. | 437/192 |
| 4,823,181 | 4/1989 | Mohsen et al. . | |
| 4,829,350 | 5/1989 | Miller . | |
| 4,847,732 | 7/1989 | Stopper et al. | 361/395 |
| 4,862,243 | 8/1989 | Welch et al. . | |
| 4,870,302 | 9/1989 | Freeman | 307/465 |
| 4,899,205 | 2/1990 | Handy et al. . | |
| 4,912,066 | 3/1990 | Wills | 437/173 |
| 4,914,055 | 4/1990 | Gordon et al. | 437/192 |
| 4,933,576 | 6/1990 | Tamamura et al. | 307/465 |
| 4,941,028 | 7/1990 | Chen et al. . | |
| 4,943,538 | 7/1990 | Mohsen et al. | 437/52 |

(List continued on next page.)

FOREIGN PATENT DOCUMENTS

| | | | |
|---|---|---|---|
| 0387887 | 9/1990 | European Pat. Off. | H01L 23/525 |
| 0414361 | 2/1991 | European Pat. Off. | H01L 23/52 |
| 0416903 | 3/1991 | European Pat. Off. | H01L 21/3205 |
| 0452091 | 10/1991 | European Pat. Off. | H01L 23/525 |
| 0455414 | 11/1991 | European Pat. Off. | H01L 23/525 |
| 0500034 | 8/1992 | European Pat. Off. | H01L 23/525 |
| 0501120 | 9/1992 | European Pat. Off. | H01L 23/525 |
| 0528417 | 2/1993 | European Pat. Off. | H01L 27/112 |
| 0539197 | 4/1993 | European Pat. Off. | H01L 23/525 |
| 2367352 | 10/1977 | France | H01L 27/06 |
| 20222024 | 2/1990 | United Kingdom | H01L 21/82 |
| 87/00969 | 2/1987 | WIPO | H01L 23/52 |
| 87/02827 | 5/1987 | WIPO | H01L 27/24 |
| 92/13359 | 8/1992 | WIPO | H01L 21/285 |
| 92/20109 | 11/1992 | WIPO | H01L 45/00 |
| 93/03499 | 2/1993 | WIPO | H01L 23/525 |
| 93/05514 | 3/1993 | WIPO | H01L 29/68 |
| 93/04499 | 3/1993 | WIPO | H01L 21/70 |

*Primary Examiner*—J. Carroll
*Attorney, Agent, or Firm*—D'Alessandro & Ritchie

[57] ABSTRACT

A static-charge protection device for an antifuse includes an additional second-sized aperture smaller in area than the antifuse apertures disposed in the same inter-electrode dielectric layer. Antifuse material is disposed in the second-sized aperture, and the upper electrode extends over the second aperture as well as the first aperture. A preferred process for fabricating the protection device utilizes the step of forming the smaller apertures and forming their antifuse material layers simultaneously with forming the antifuse apertures. A static-charge protection device for an antifuse device includes an additional second-sized aperture larger in area than the first-sized antifuse apertures. Metal plug material is deposited and etched back. A layer of amorphous silicon antifuse material is formed and defined over the first and second sized apertures, the portion formed over the larger partially filled antifuse protection device cell being thinner.

8 Claims, 7 Drawing Sheets

U.S. PATENT DOCUMENTS

| | | | |
|---|---|---|---|
| 5,070,384 | 12/1991 | McCollum et al. | |
| 5,075,762 | 12/1991 | Kondo et al. | 357/71 |
| 5,093,711 | 3/1992 | Hirakawa | 357/71 |
| 5,095,362 | 3/1992 | Roesner | 357/23.4 |
| 5,100,827 | 3/1992 | Lytle | 437/52 |
| 5,111,262 | 5/1992 | Chen et al. | |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/465 |
| 5,171,715 | 12/1992 | Husher et al. | |
| 5,191,550 | 3/1993 | Kubota | 365/96 |
| 5,194,759 | 3/1993 | El-Ayat et al. | 307/202.1 |
| 5,196,724 | 3/1993 | Gordon et al. | 257/530 |
| 5,219,782 | 6/1993 | Liu et al. | 257/530 |
| 5,233,206 | 8/1993 | Lee et al. | 257/50 |
| 5,233,217 | 8/1993 | Dixit et al. | |
| 5,241,496 | 8/1993 | Lowrey et al. | 365/96 |
| 5,242,851 | 9/1993 | Choi | 437/49 |
| 5,248,632 | 9/1993 | Tung et al. | 437/195 |
| 5,250,459 | 10/1993 | Lee | 437/52 |
| 5,266,829 | 11/1993 | Hamdy et al. | 257/530 |
| 5,270,251 | 12/1993 | Cohen | 437/173 |
| 5,272,101 | 12/1993 | Forouhi et al. | 257/530 |
| 5,272,666 | 12/1993 | Tsang et al. | 365/96 |
| 5,284,788 | 2/1994 | Spratt et al. | 437/52 |
| 5,286,993 | 2/1994 | Lowrey et al. | 257/390 |
| 5,290,734 | 3/1994 | Boardman et al. | |
| 5,298,784 | 3/1994 | Gambino et al. | 257/529 |
| 5,300,456 | 4/1994 | Tigelaar et al. | |
| 5,302,546 | 4/1994 | Gordon et al. | 437/170 |
| 5,308,795 | 5/1994 | Hawley et al. | |
| 5,322,812 | 6/1994 | Dixit et al. | |
| 5,327,024 | 7/1994 | Cox | 307/465 |
| 5,328,865 | 7/1994 | Boardman et al. | 257/530 |
| 5,329,153 | 7/1994 | Dixit | 257/530 |
| 5,341,267 | 8/1994 | Whitten et al. | 257/530 |
| 5,353,246 | 10/1994 | Tsang et al. | 365/96 |
| 5,404,029 | 4/1995 | Husher et al. | 257/50 |
| 5,412,593 | 5/1995 | Magel et al. | 365/96 |

5,519,248

CIRCUITS FOR ESD PROTECTION OF METAL-TO-METAL ANTIFUSES DURING PROCESSING

CROSS-REFERENCE TO RELATED APPLICATION

This application is a continuation of U.S. patent application Ser. No. 08/087,942 filed Jul. 7, 1993 in the name of inventors Yeouchung Yen, Wenn-Jei Chen, Steve S. Chiang and Abdul R. Forouhi and entitled "Circuits for ESD Protection of Metal-to-Metal Antifuses During Processing", U.S. Pat. No. 5,369,054.

BACKGROUND OF THE INVENTION

1. Field of the Invention

The present invention relates to user-programmable antifuse technology. More particularly, the present invention relates to metal-to-metal antifuse elements and to devices and circuits for protecting metal-to-metal antifuses from the effects of electrostatic discharge during the fabrication process which produces them.

2. The Prior Art

During the fabrication process used for manufacturing circuits including antifuse elements, the integrated circuit wafer is exposed to environments which are potentially harmful to the antifuse material positioned between the lower and upper antifuse electrodes. For example, reactive ion plasma etching techniques employed to anisotropically define small geometry features can result in the accumulation of large static charges giving rise to high voltages across sensitive insulating areas in the integrated circuit being fabricated.

Antifuse materials, including dielectric materials, which are engineered to rupture at predictable voltages, are particularly sensitive to this phenomena. The voltages generated by static charge buildup can easily exceed the programming voltages of the antifuse devices and can thus inadvertently disrupt the antifuse material during processing and destroy the device by programming it. Where the antifuse material utilized is amorphous silicon, silicon dioxide or silicon nitride it is of vital importance to protect the antifuse material layer from damage during the plasma etch step defining this layer. If the antifuse structure is not protected from static charge buildup during plasma etch, a potentially high number of defects will appear in the antifuse material in the form of short-circuited antifuse circuits, since charge buildup can only be released through the antifuse material layer.

One structure for protection of antifuses during processing is disclosed in U.S. Pat. No. 4,941,028 to Chen et al., which teaches the use of both active MOS transistor structures and deliberately-thinned dielectrics formed over a lightly-doped region in a substrate to protect antifuse material comprising thin dielectric structures during semiconductor processing steps which form the antifuses.

It is not always possible, however, to provide static-charge protection schemes which rely on active devices or doped regions in a semiconductor substrate as do the solutions presented by Chen et al. For example, when the insulating layer to be protected is an antifuse material layer in an antifuse device disposed between two metal-interconnect layers in a microcircuit structure such as an integrated circuit, it may not always be practicable to provide a static-charge protection device which relies on active transistor regions occupying space in a semiconductor substrate. Accordingly, it would be advantageous to provide a static-charge protection circuit to protect antifuses disposed between metal interconnect layers.

BRIEF DESCRIPTION OF THE INVENTION

According to a first aspect of the present invention, a static-charge protection device protects from static charge damage one or more antifuse devices employing antifuse material such as amorphous silicon. This embodiment of the present invention relies on the differential step coverage resulting from depositing material into different sized apertures. Each of the antifuse devices to be protected comprises a lower electrode separated from an upper electrode by an inter-metal dielectric layer and an antifuse material disposed in a first sized aperture in the inter-metal dielectric layer. If necessary, barrier layers are interposed in the first sized aperture between the upper electrode and the antifuse material and the lower electrode and the antirinse material.

The protection device according to the first embodiment of the invention for protecting one or more antifuses comprises an additional second-sized aperture smaller in area than the first-sized apertures. The amorphous silicon antifuse material and the barrier layers are also disposed in the second-sized aperture, and the upper electrode of the antifuse or antifuses to be protected extends over the second aperture as well as the first aperture.

The amorphous silicon antifuse material layer may be formed simultaneously in both apertures, but, because of the difference in step coverage provided by the different sized apertures, the breakdown voltage, or "programming" voltage of the device formed in the smaller aperture is smaller by a margin which insures that any static charge buildup which creates a potential difference between the lower and upper electrodes will disrupt the antifuse material in the smaller aperture first, thus providing a path for discharging the static charge buildup and protecting the antifuse structures formed in the larger apertures. The process for fabricating the protection device utilizes the step of forming the smaller charge protection device apertures simultaneously with the antifuse apertures. The metal line underlying the smaller apertures is connected to a doped region in the substrate forming a leaky reversed biased diode to provide a discharge path to the substrate.

According to a second embodiment of the present invention, a static-charge protection device is provided for one or more antifuse devices employing amorphous silicon antifuse material, each of the antifuse devices comprising a lower electrode separated from an upper electrode by an inter-metal dielectric layer and an amorphous silicon antifuse material disposed in a first aperture in the inter-metal dielectric layer.

According to the second embodiment of the invention the static-charge protection device for protecting one or more antifuses comprises a second aperture in the inter-metal dielectric layer. The amorphous silicon antifuse material is also disposed in the second aperture, however, the barrier layer separating the lower electrode of the static-charge protection device from the antifuse material layer is eliminated. The amorphous silicon antifuse material layer is in contact with the aluminum layer, and amorphous silicon and aluminum spiking will occur to provide a lower breakdown voltage path in the protection device than in the antifuse to be protected.

According to a third embodiment of the present invention, a static-charge protection device is provided for one or more antifuse devices employing amorphous silicon antifuse material, each of the antifuse devices comprising a lower electrode separated from an upper electrode by an inter-metal dielectric layer and an antifuse material disposed in a first sized aperture in the inter-metal dielectric layer.

According to the third embodiment of the present invention, the static-charge protection device is formed in a second-sized aperture larger in area than the first-sized aperture. A blanket deposition of a layer of barrier material, such as tungsten, is formed, followed by an etchback of the barrier material. The difference in size between the first-sized antifuse apertures and the second-sized static-charge protection device aperture results in the etchback step clearing the tungsten barrier layer from a portion of the metal electrode at the bottom of the second-sized static-charge protection device aperture and leaving only spacers at the edges of the static-charge protection device aperture, while leaving a barrier layer intact at the bottom of the first-sized antifuse apertures.

A layer of antifuse material, such as amorphous silicon is then formed in the first-sized and second-sized apertures, and an upper metal layer is formed over the antifuse material layer. The amorphous silicon antifuse material layer in the second-sized static-charge protection device aperture is in contact with the aluminum layer, and amorphous silicon and aluminum spiking will occur to provide a lower breakdown voltage path in the static-charge protection device than in the antifuse to be protected.

According to a fourth embodiment of the present invention, a static-charge protection device is provided for one or more antifuse devices employing amorphous silicon antifuse material, each of the antifuse devices comprising a lower electrode separated from an upper electrode by an inter-metal dielectric layer and an amorphous silicon antifuse material disposed in an antifuse aperture formed in the inter-metal dielectric layer. The static-charge protection device is formed in a static-charge protection device aperture formed in the inter-metal dielectric layer.

According to this aspect of the present invention, prior to the formation of the antifuse apertures and the static-charge protection device aperture, the inter-metal dielectric layer in the region where the antifuse apertures are formed is deliberately thinned using an etchback step in which the static-charge protection device region of the inter-metal dielectric layer is protected by an etch mask. Antifuse and static-charge protection device apertures are then formed in the inter-metal dielectric layer. Because of the etchback step, the antifuse apertures will be shallower than the static-charge protection device aperture.

A layer of tungsten is then deposited in the apertures using a selective bottom up tungsten deposition chemistry. The resulting tungsten plugs in the antifuse apertures will form a planar surface with the top of the inter-metal dielectric layer, while the tungsten plugs will not completely fill the static-charge protection device apertures. A layer of antifuse material is then deposited, followed by a second metal layer. Because the tungsten plug in the static-charge protection device aperture does not completely fill it, the step coverage will result in a weakened antifuse material layer in the static-charge protection device aperture.

According to a fifth embodiment of the present invention, provision may be made to upgrade a fabrication process from a traditional aluminum sputter process to a via plug technology without the need to rework the mask set used in the process by providing a first sized antifuse aperture and both second and third sized static-charge protection device apertures, wherein the second sized aperture is smaller than the antifuse aperture and the third sized aperture is larger than the antifuse aperture. Depending on whether aluminum sputter technology or via plug technology is employed, the protection device in only one of the second and third sized apertures will have a breakdown voltage lower than that of the antifuses.

According to a sixth embodiment of the present invention, a static-charge protection device is provided for one or more antifuse devices employing amorphous silicon antifuse material, each of the antifuse devices comprising a lower electrode separated from an upper electrode by an inter-metal dielectric layer and an antifuse material disposed in a first aperture in the inter-metal dielectric layer.

According to the sixth embodiment of the present invention the static-charge protection device comprises a lower electrode contacted to the upper electrode which extends over both the antifuse and the static-charge protection device through a second aperture formed in the inter-metal dielectric layer to form a discharge path, Antifuse material is also disposed in a portion of the second aperture.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The present invention may be utilized in a number of microcircuit structures. These structures include integrated circuits, integrated interconnect architectures, whether or not containing active transistor elements, and other structures which employ antifuse elements. These structures will be referred to collectively herein as microcircuits and microcircuit structures.

It is well known that the performance of certain materials processing steps during microcircuit fabrication processes generate static charges which can result in the buildup of voltage potentials across layers of material which are potentially harmful to those layers. Of particular significance in antifuse fabrication processes are reactive ion etching processes used to etch small-geometry features. The charge buildup caused by these plasma etching processes can generate voltages which may easily disrupt the antifuse material disposed between the two antifuse electrodes and thus destroy the antifuse by programming it during the fabrication process.

According to the present invention, a way to avoid or minimize this radiation damage is to provide a path that offers lower resistance or lower breakdown voltage than the path which is sought to be protected. A first aspect of the present invention utilizes the fact that deposition of material into different sized apertures results in different step coverage when depositing antifuse material in the two apertures, the larger aperture receiving a thicker layer of material. While this phenomenon has been generally understood, it has largely been regarded as a problem. It is not believed that anyone in the art has recognized that the phenomenon can be deliberately and usefully employed in microcircuit processing.

The first aspect of the present invention beneficially utilizes differential step coverage to form novel antifuse protection devices utilizing a novel process. Different step coverage in different sized apertures is utilized to form antifuse materials in an antifuse protection structure which provide a lower-breakdown-voltage path than the path provided through desired antifuse structures on the microcircuit.

Figure 1:
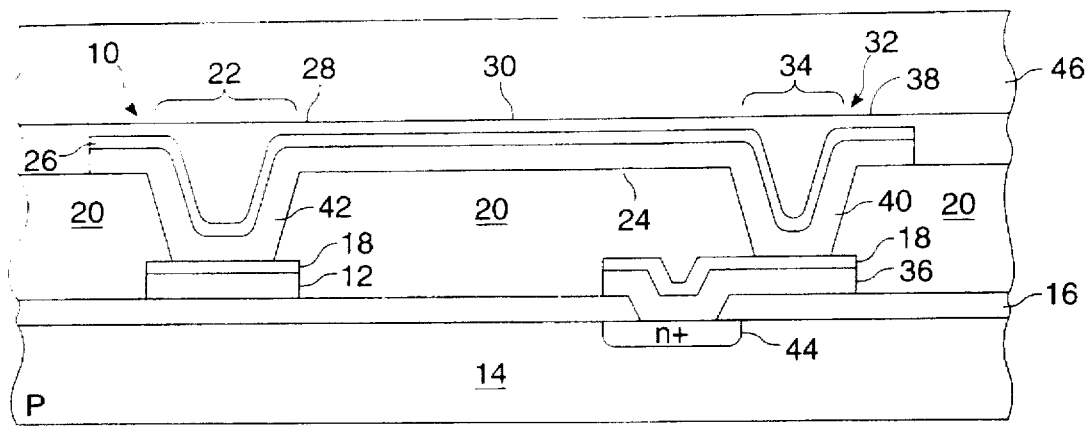
FIG. 1 is a cross-sectional view of a portion of a microcircuit structure including a metal-to-metal antifuse device and a static charge protection device according to a first embodiment of the present invention.

Referring first to FIG. 1, a cross-sectional view of a portion of a microcircuit structure is shown including a metal-to-metal antifuse device and a static-charge protection device according to a first aspect of the present invention. As may be seen from FIG. 1, antifuse 10 comprises a lower antifuse electrode 12 disposed over a substrate 14 and an intervening insulating layer 16. Lower antifuse electrode 12 for the antifuse 10 will usually comprise a portion of a first metal layer in the circuit structure and, if necessary (such as where the antifuse material comprises a layer of amorphous silicon), will be covered with a lower barrier layer 18 as is known in the art. As will be appreciated by those of ordinary skill in the art, insulating layer 16 may be required because of the conductive or semiconductive nature of the underlying substrate 14 or as an adhesion promoting layer. The illustrative embodiment of FIG. 1 shows the application of the present invention to an integrated circuit and therefore substrate 14 is a semiconductor substrate as illustrated.

An inter-metal dielectric layer 20 disposed over lower antifuse electrode 12 includes an antifuse aperture 22 formed therein. An antifuse material layer 24 is disposed within antifuse aperture 22 and is preferably substantially contiguous with the periphery of the antifuse aperture 22. A typical antifuse material for use in a metal-to-metal antifuse is amorphous silicon. If necessary due to the nature of the antifuse material, an upper barrier layer 26 is disposed over antifuse material layer 24. Those of ordinary skill in the art will appreciate that lower and upper barrier layers 18 and 26 are used to prevent contamination of the antifuse material due to metal atom diffusion. Finally, an upper antifuse electrode 28 comprising a portion of a second metal layer 30 is disposed over the surface of upper barrier layer 26 and inter-metal dielectric layer 20.

The lower antifuse electrode 12 and the upper antifuse electrode 28 of antifuse 10 will usually comprise a portions of metal interconnect layers in the circuit structure. Those of ordinary skill in the art will appreciate that the words "first" and "second" metal layers are used in a relative sense throughout this disclosure, and are not necessarily constrained to be the first and second metal interconnect layers in a two or three level metal integrated circuit technology.

According to a typical current state-of-the-art fabrication process, inter-metal dielectric layer 20 will have a thickness of about between 0.7 to 1.0 microns. In such a process, antifuse aperture 22 may typically be a 0.8 micron aperture. Those of ordinary skill in the art will recognize that technical progress will predictably scale these parameters.

A static-charge protection device 32 for antifuse 10 which may be fabricated simultaneously with antifuse 10 is also shown in FIG. 1. Antifuse protection device 32 is formed between the same metal interconnect layers which form lower antifuse electrode 12 and upper antifuse electrode 28 of antifuse 10 and is formed in a static-charge protection device aperture 34 in which the antifuse material layer 24 is disposed. As shown in FIG. 1, a lower static-charge protection device electrode 36 for static-charge protection device 32 is formed from the same metal layer as lower antifuse electrode 12 of antifuse 10 and is also covered by lower barrier layer 18. An upper static-charge protection device electrode 38 comprising a portion of metal layer 30 is disposed over antifuse material layer 24. Where necessary, the upper barrier layer 26 is disposed between the antifuse material layer 24 and the upper static-charge protection device electrode 38.

As can be clearly seen from an examination of FIG. 1, static-charge protection device aperture 34 is smaller in size than antifuse aperture 22. In a typical embodiment where antifuse aperture 22 is 0.8 microns, static-charge protection device aperture 34 may be between about 0.6 to 0.7 microns. By so sizing static-charge protection device aperture 34 with respect to antifuse aperture 22, the step coverage of antifuse material layer 24 at region 40 in the bottom of static-charge protection device aperture 34 will be different than the step coverage of antifuse material layer 24 at region 42 in antifuse aperture 22. In particular, antifuse material layer 24 at region 40 at the bottom of static-charge protection device aperture 34 will be thinner than the antifuse material layer 24 at region 42 in the bottom of antifuse aperture 22.

Because of this thickness differential, the voltage between lower static-charge protection device electrode 36 and upper static-charge protection device electrode 38 at which antifuse material layer 24 in region 40 in static-charge protection device 32 will disrupt will be about 2 to 3 volts less than the voltage at which the antifuse material layer 24 in region 42 in antifuse 10 will rupture. This voltage differential will provide a margin of static-charge voltage protection for antifuse 10 due to the fact that the rupture of antifuse material layer 24 in region 40 will result in a discharge path for static-charge built up through the static-charge protection device 32.

As shown in FIG. 1, the discharge path includes doped region 44 in substrate 14. The doped region 44 is reverse biased so as to isolate the static-charge protection device 32 during the normal operation of the circuit containing the antifuse 10. However, during fabrication, carriers generated during the process steps which cause static-charges will render the reverse biased junction leaky, allowing the discharge of the static-charge buildup to the substrate 14.

Finally, as illustrated in FIG. 1, and as will be appreciated by those of ordinary skill in the art, a conventional passivation layer 46 is formed over the top of second metal layer 30. This layer seals the structures of the antifuse 10 and the static-charge protection device 32.

Figure 2A:
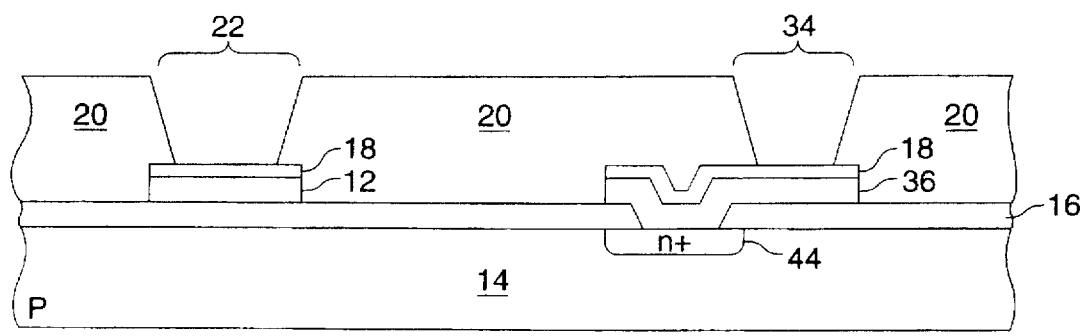
FIGS. 2a–2c are cross-sectional views of the microcircuit structure depicted in FIG. 1 shown after the completion of selected steps in the fabrication process.
Figure 2B:
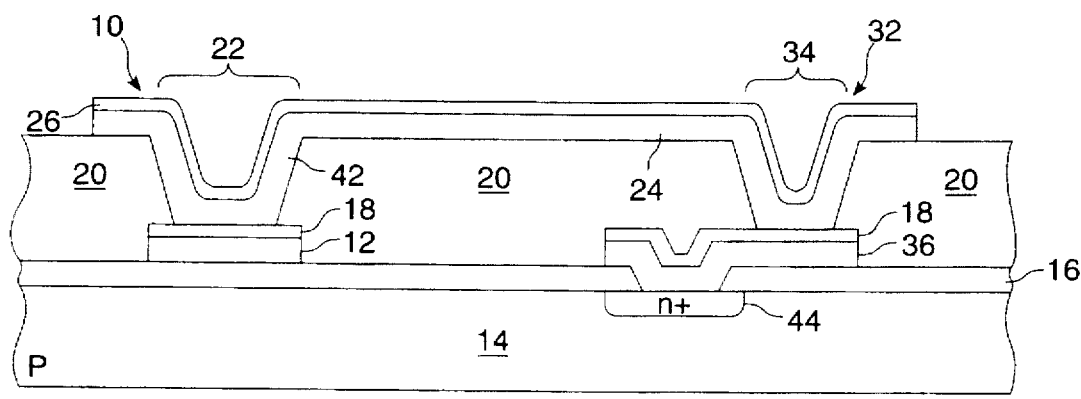
Figure 2C:
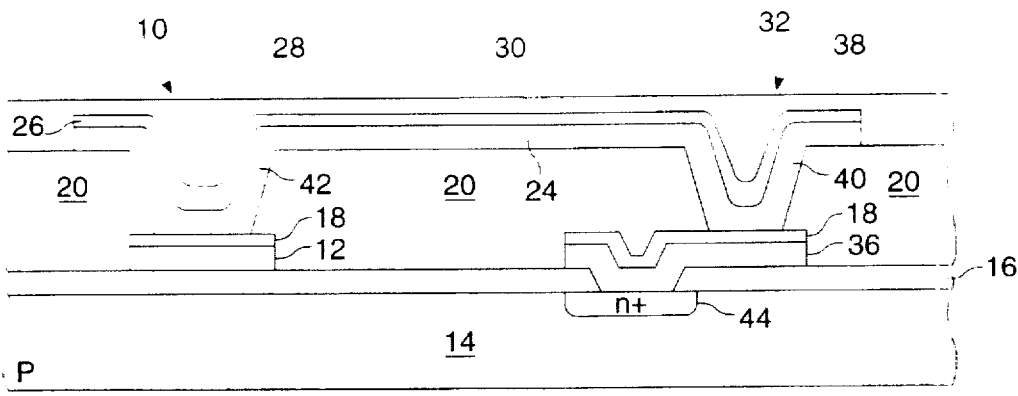

FIGS. 2a–2c are cross-sectional views of the microcircuit structure depicted in FIG. 1 shown after the completion of selected steps in the fabrication process. FIGS. 2a–2c illustrate a typical process according to the present invention for forming the structures depicted in FIG. 1.

Referring first to FIG. 2a, a first conductive layer has been formed and defined into lower antifuse electrode 12 and lower static-charge protection device electrode 36 over insulating layer 16 on substrate 14 using conventional materials processing techniques. Lower antifuse electrode 12 and lower static-charge protection device electrode 36 may be formed from any material known to be useful for metal interconnect technology.

Note that contact has been made to doped region 44 in substrate 14 to form the discharge path for electro-static charge into substrate 14. It will be appreciated by those skilled in the art that in embodiments of the present invention formed on a semiconductor substrate that doped region 44 will be formed during the process steps which form the doped regions for active devices in the substrate, and the contact region will likewise be formed during formation of other substrate contact regions.

A lower barrier layer 18 is formed over the lower antifuse electrode 12 and lower static-charge protection device electrode 36 using conventional processing techniques. An inter-metal dielectric layer 20 is formed over the lower antifuse electrode 12, the lower static-charge protection device electrode 36, and the substrate 14. As presently preferred, inter-metal dielectric layer 20 may be formed from a PECVD silicon dioxide layer using conventional processing techniques. Antifuse aperture 22 and static charge protection device aperture 34 have been formed in inter-metal dielectric layer 20 by employing conventional photolithography and etching steps.

Antifuse aperture 22 and static charge protection device aperture 34 may be formed in the same step by altering the mask which is used to define antifuse aperture 22 to provide the additional features for the geometry of one or more static charge protection device apertures 34. By utilizing the same mask for forming both apertures, static-charge protection devices 32 may be provided in the microcircuit structure without increasing the number of processing steps in the fabrication process.

Referring now to FIG. 2b, an antifuse material layer 24 including regions 42 and 40 is disposed over the surface of inter-metal dielectric layer 20 and in antifuse aperture 22 and static charge protection device aperture 34. A barrier layer 26 is then disposed over the surface of the antifuse material layer. The antifuse material layer 24 and the barrier layer 26 are defined by masking and etching. Both the deposition and definition of antifuse material layer 24 and the barrier layer 26 are performed using conventional processing techniques. In the process illustrated in FIGS. 2a–2c, the antifuse material employed is a layer of amorphous silicon. Because of the difference in size between antifuse aperture 22 and static charge protection device aperture 34, the step coverage of amorphous silicon material in regions 42 and 40 in those two apertures will differ, resulting in a thicker layer of amorphous silicon material in region 42 at the bottom of antifuse aperture 22.

If inter-metal dielectric layer 20 is between about 0.7 to 1.0 microns thick, antifuse aperture 22 is about 0.8 microns in diameter, and an amorphous silicon antifuse material having a thickness of about 2,500 Å is used, the antifuse 10 will have a breakdown (i.e., programming) voltage of about 11 volts. If a static charge protection device aperture 34 of about 0.6 to 0.7 microns in diameter is employed, the differential step coverage will be sufficient to result in a breakdown voltage of about 8 volts for the protection device.

Referring now to FIG. 2c, the antifuse material layer 24 has been defined, an upper barrier layer 26 has been disposed thereon, and a second metal layer 30 is formed thereover. Portions 28 and 38 of second metal layer 30 form the upper antifuse electrode and the upper static-charge protection device electrode, respectively. The structure depicted in FIG. 2c is essentially complete from the standpoint of the present invention, although those of ordinary skill in the art will recognize that other processing steps may be performed to complete other structures contained within the microcircuit structure containing the antifuses.

Figure 3:
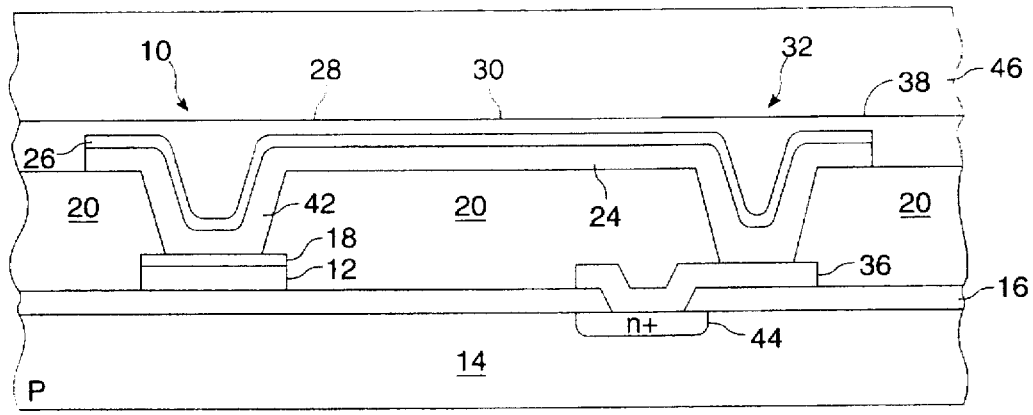
FIG. 3 is a cross-sectional view of a portion of a microcircuit structure including a metal-to-metal antifuse device and a static charge protection device according to a second embodiment of the present invention.

Referring now to FIG. 3, a variation of the static-charge protection device 32 of FIG. 1 of the present invention is illustrated in which the lower barrier layer 18 covering the lower static charge protection device electrode of the static charge protection device 32 has been removed. The static charge protection device 32 of FIG. 3 may be fabricated according to the process sequence illustrated in FIGS. 2a–c, including the additional step of removing the portion of the lower barrier layer 18 in static charge protection device aperture 34. Alternatively, the lower barrier layer 18 may be selectively formed so that it does not exist over the lower electrode 36 of static charge protection device 32.

By directly contacting the lower static charge protective device electrode 36 of the static charge protection device 32 with the region 40 of antifuse material layer 24, the metal in the lower static charge protection device electrode 36 will come into contact with and more readily diffuse through the region 40 of the antifuse material layer 24 covering the lower electrode 36 and thus provide an discharge path for charge buildup which forms at a lower voltage than the antifuse programming voltage.

According to another aspect of the invention, a metal plug fill process is used to produce two different embodiments of a static-charge protection device. Two variations of this aspect of the invention are presented in the embodiments depicted in FIGS. 4 and 5a–5d, and 6 and 7a–7d, respectively. Because of the use of plug technology, barrier layers are unnecessary above and below the respective lower and upper electrodes of the antifuse and static-charge protection devices.

Figure 4:
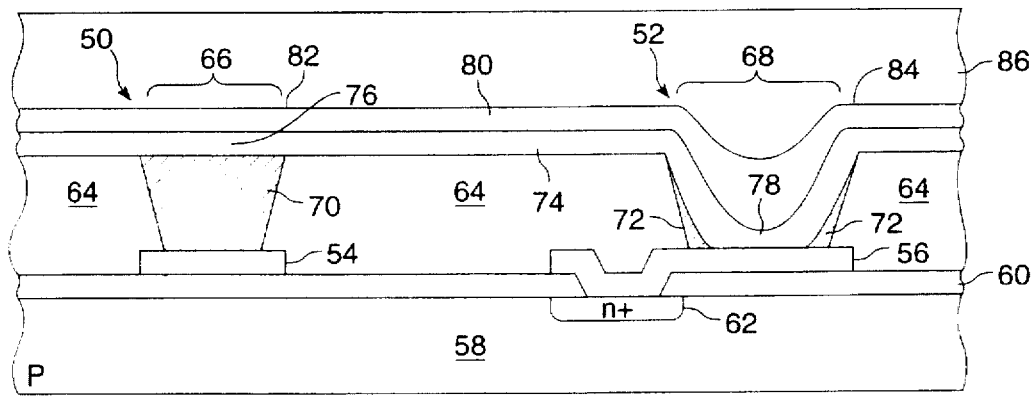
FIG. 4 is a cross-sectional view of a portion of a microcircuit structure including a metal-to-metal antifuse device and a static charge protection device according to a third embodiment of the present invention.

Referring first to FIG. 4, a cross sectional diagram of an antifuse device and a static-charge protection device according to a third embodiment of the present invention is shown. As may be seen from FIG. 4, antifuse 50 and static-charge protection device 52 comprise lower antifuse electrode 54 and lower static-charge protection device electrode 56, respectively, disposed over a substrate 58 and an intervening insulating layer 60. The lower antifuse electrode 54 and lower static-charge protection device electrode 56 will usually comprise portions of a first metal layer in the circuit structure, but unlike some implementations of the embodiment of FIG. 1, the first metal layer is not covered with a barrier layer.

As in the embodiment depicted in FIG. 1, those of ordinary skill in the art will appreciate that insulating layer 60 may be required because of the conductive or semiconductive nature of the underlying substrate 58 or as an adhesion promoting layer. The illustrative embodiment of FIG. 4 shows the application of the present invention to an integrated circuit and therefore it will be appreciated by those skilled in the art that lower static-charge protection device electrode 56 is contacted to doped region 62 in the semiconductor substrate 58 to form a discharge path for static charge buildup into substrate 14.

An inter-metal dielectric layer 64 disposed over lower antifuse electrode 54, lower static-charge protection device electrode 56, and the substrate 58 includes an antifuse aperture 66 and a static charge protection device aperture 68 formed therein. As can be most clearly seen from an examination of FIG. 4, static charge protection device aperture 68 is larger in size than antifuse aperture 66. In a typical embodiment where inter-metal dielectric layer 64 may have a thickness of about between 0.8 to 1.0 microns and antifuse aperture 66 is 0.8 microns, static charge protection device aperture 68 may be between about 1.2 to 2 microns, and typically about 2 microns. Those of ordinary skill in the art will recognize that technical progress will predictably scale these parameters.

A metal plug material 70 is disposed in antifuse aperture 66, and forms sidewall spacers 72 in static charge protection device aperture 68. An antifuse material layer 74 is disposed over and is preferably substantially contiguous with the periphery of the antifuse aperture 66 in region 76, and is also disposed within static charge protection device aperture 68 in region 78. As in the embodiment of FIG. 1, a typical antifuse material for use in the metal-to-metal antifuse of FIG. 4 is amorphous silicon.

Finally, a second metal layer 80 is disposed over the surface of antifuse material layer 74 and forms upper antifuse electrode 82 and upper static-charge protection device electrode 84.

As disclosed, the layer of antifuse material layer 74 is formed over the surface of the structure. The region 76 of antifuse material in the antifuse 50 will be formed over the metal plug material 70, which, in effect, acts as a barrier layer. In contrast, the antifuse material layer 74 in region 78 in region 78 at the bottom of static-charge protection device aperture 68 rests directly on the aluminum material of the lower static-charge protection device electrode 56. Diffusion of aluminum into the antifuse material will lower its breakdown voltage considerably, such that the voltage between lower static-charge protection device electrode 56 and the upper static-charge protection device electrode 84 at which antifuse material layer 74 in region 78 in a static-charge protection device 52 will disrupt will be at least 3 volts less than the voltage at which antifuse material layer 74 in region 76 in antifuse 50 will rupture. This voltage differential will provide a margin of static charge voltage protection for antifuse 50 because when antifuse material layer 74 in region 78 disrupts, lower static-charge protection device electrode 56 will be connected to upper static-charge protection device electrode 84, thus forming a discharge path for charge built up on upper metal layer 80.

In the illustrative embodiment shown in FIG. 4, substrate 58 is a semiconductor substrate, and the discharge path includes doped region 62 in substrate 58. As in the embodiment shown in FIG. 1, the doped region 62 is reverse biased, and will isolate the static-charge protection device 52. Finally, as illustrated in FIG. 4, and as will be appreciated by those of ordinary skill in the art, a conventional passivation layer 86 is formed over the top of second metal layer 80.

FIGS. 5a–5d are cross-sectional views of the microcircuit structure depicted in FIG. 4 shown after the completion of selected steps in the fabrication process which illustrate the process according to this embodiment of the invention.

Figure 5A:
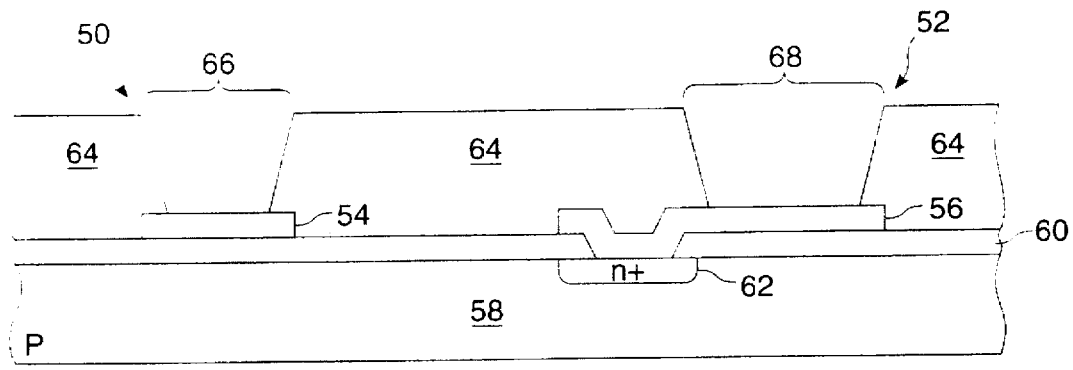
FIGS. 5a–5d cross-sectional views of the microcircuit structure depicted in FIG. 4 shown after the completion of selected steps in the fabrication process.

Referring first to FIG. 5a, the microcircuit structure containing this embodiment of the present invention is seen following the formation of insulating layer 60 on the surface of substrate 58, the formation of doped region 62 in substrate 58, and the formation of the first metal layer and into the lower antifuse electrode 54 the lower static-charge protection device electrode 56. In addition, the inter-metal dielectric layer 64 has been formed with antifuse aperture 66 and the larger-sized static-charge protection device aperture 68 formed therein. Those of ordinary skill in the art will recognize that the processing steps may be performed using conventional semiconductor processing technology.

Figure 5B:
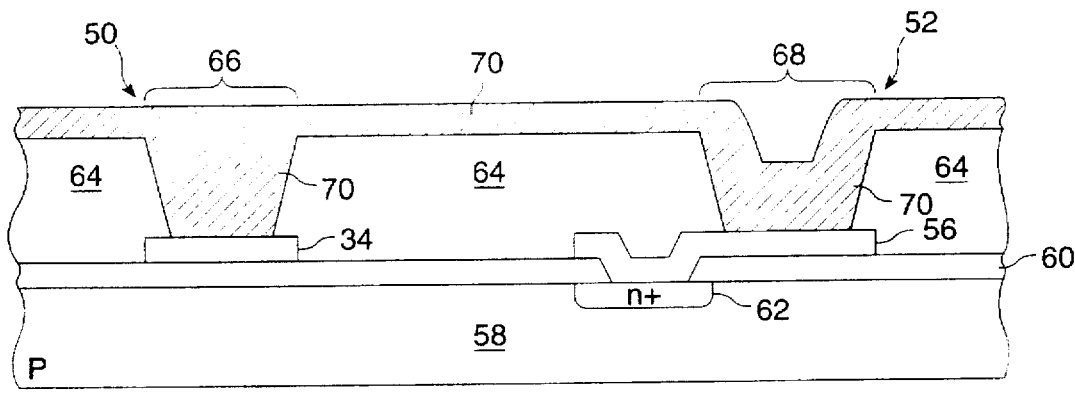

Referring now to FIG. 5b, the structure is shown after a blanket deposition of a metal plug material 70, such as tungsten, has been disposed over inter-metal dielectric layer 64 and into antifuse aperture 66 and static-charge protection device aperture 68. Deposition techniques useful for fabricating the structures of the present invention are known to those of ordinary skill in the art. A discussion of illustrative known blanket and selective deposition techniques suitable for the plug processes described herein is found in Wolf and Tamber, Silicon Processing for the VLSI Era, Vol. 1, pp. 400–403.

Figure 5C:
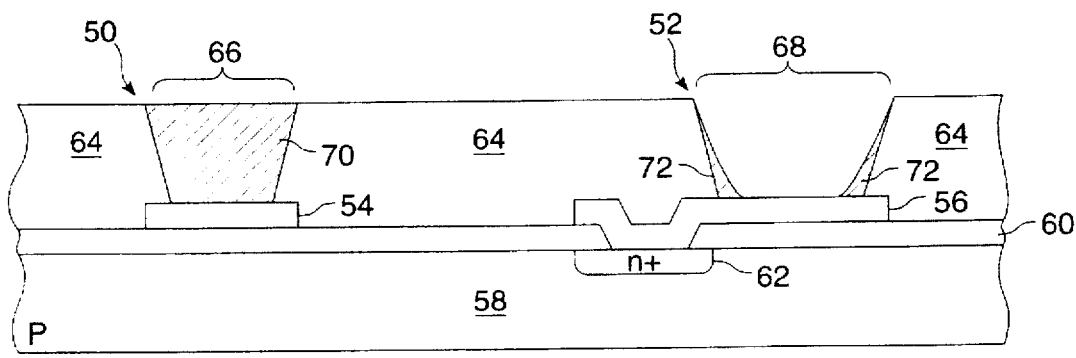

Referring now to FIG. 5c, a metal etchback of the blanket deposition of tungsten has been performed to form the metal plug material 70 in antifuse aperture 66 and the sidewall spacers 72 in static-charge protection device aperture 68. By so sizing static-charge protection device aperture 68 with respect to antifuse aperture 66, the coverage of the metal plug material remaining after the etchback step at the bottom of static-charge protection device aperture 68 will be different than the coverage of the metal plug material in the antifuse aperture 66. In particular, the plug material at the bottom of static-charge protection device aperture 68 will be etched away, leaving only sidewalls 72 after an etchback of the plug material using conventional processing techniques has been performed.

Figure 5D:
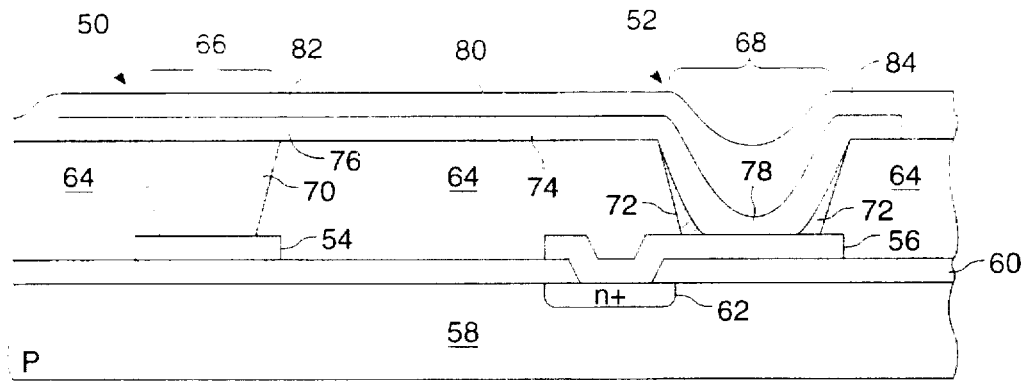

Referring now to FIG. 5d, an antifuse material layer 74 has been formed having a region 76 preferably substantially contiguous with antifuse aperture 66 and a region 78 within static-charge protection device aperture 68. It can be seen that region 78 of the antifuse material layer 74 is in direct contact with the aluminum of the lower static-charge protection device electrode 56. Those of ordinary skill in the art will appreciate that this will cause contamination of the amorphous silicon antifuse material layer 74 in region 78 with aluminum atoms and this contamination will lower the breakdown voltage of the static-charge protection device 52.

Next, the second metal layer 80 is disposed over the surface of antifuse material layer 74 using conventional processing techniques and forming upper antifuse electrode 82 and static charge protection device electrode 84. The structure depicted in FIG. 5d is essentially complete, and conventional steps, such as passivation and other back-end steps, may be performed to complete the device in which the depicted structure resides.

Figure 6:
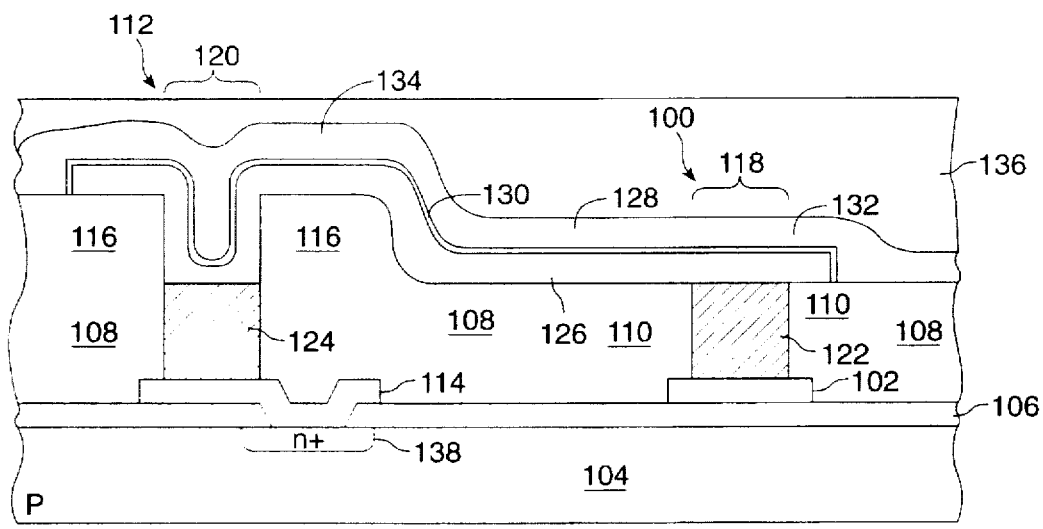
FIG. 6 is a cross-sectional view of a portion of a microcircuit structure including metal-to-metal antifuse device and a static charge protection device according to a fourth embodiment of the present invention.

Referring now to FIG. 6, a cross-sectional view of a portion of a microcircuit structure including a metal-to-metal antifuse device and a static charge protection device according to a fourth embodiment of the present invention is shown. As may be seen from FIG. 6, antifuse 100 comprises a lower antifuse electrode 102 disposed over a substrate 104 and an intervening insulating layer 106. As in the previously disclosed embodiments, the lower antifuse electrode 102 of antifuse 100 will usually comprise a portion of a first metal layer in the circuit structure. As in the plug-process embodiment of FIG. 4, the lower antifuse electrode 102 of antifuse 100 is not covered with a barrier layer.

An inter-metal dielectric layer 108 lies over the lower antifuse electrode 102. As may be easily seen from FIG. 6 and as will be more fully described later herein, a first region 110 of the inter-metal dielectric in which the antifuse 100 is formed (at the right hand side of FIG. 6) has a first thickness. A static-charge protection device 112 according to this embodiment of the present invention is shown on the left hand side of FIG. 6 and includes a lower static-charge protection device electrode 114, which may be formed from a portion of the same first metal layer used to form lower antifuse electrode 102. Lower static-charge protection device electrode 114 is covered by a second region 116 of inter-metal dielectric layer 108 having a second thickness greater than the thickness of first region 110.

Antifuse aperture 118 is formed in first region 110 of inter-metal dielectric layer 108 and static-charge protection device aperture 120 is formed in second region 116 of inter-metal dielectric layer 108. Antifuse aperture 118 and static-charge protection device aperture 120 are filled with via plugs 122 and 124, respectively, using selective plug fill technology. Because the second region 116 of inter-metal dielectric layer 108 is thicker than first region 110, via plug 124 does not completely fill static-charge protection device aperture 120, while via plug 122 does completely fill antifuse aperture 118.

An antifuse material layer 126 is formed over inter-metal dielectric layer 108 and in the regions of antifuse and static-charge protection device apertures 118 and 120. While the interface of the antifuse material layer 126 and via plug 122 is substantially planar, the interface of antifuse material layer 126 and via plug 124 is a stepped interface wherein antifuse material layer 126 provides a step coverage type of structure. The nature of the step coverage is such that breakdown of the antifuse material layer 126 will be preferential in the region of static-charge protection device 112 over the region of antifuse 100.

Second metal layer 128 is formed over antifuse material layer 126 with an intervening barrier layer 130. The second metal layer 128 forms the upper antifuse electrode 132 and the upper static-charge protection device electrode 134. Finally, a passivation layer 136 is disposed over second metal layer 128.

As in the other embodiments disclosed herein, the static-charge protection device 112 is connected to the substrate through doped region 138, which provides a discharge path for static charge which builds up on the circuit structures to be protected.

Referring now to FIGS. 7a–7d, cross-sectional views are shown of the microcircuit structure depicted in FIG. 6 shown after the completion of selected steps in the fabrication process and illustrate the process according to this embodiment of the invention.

Figure 7A:
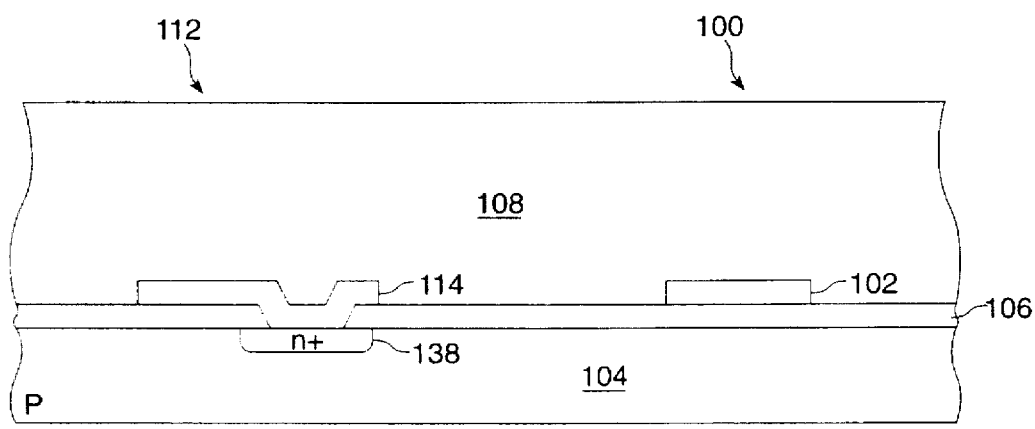
FIGS. 7a–7d are cross-sectional views of the microcircuit structure depicted in FIG. 6 shown after the completion of selected steps in the fabrication process.

Referring first to FIG. 7a, the microcircuit structure containing this embodiment of the present invention is seen following the formation of insulating layer 106 on the surface of substrate 104, the formation of doped region 138 in substrate 104, the formation of the first metal layer and its definition into lower antifuse electrode 102 and lower static-charge protection device electrode 114. In addition, the inter-metal dielectric layer 108 has been formed. Those of ordinary skill in the art will recognize that the processing steps may be performed using conventional semiconductor processing technology. These steps are identical to the steps which would be necessary to form antifuse 100 by itself.

Figure 7B:
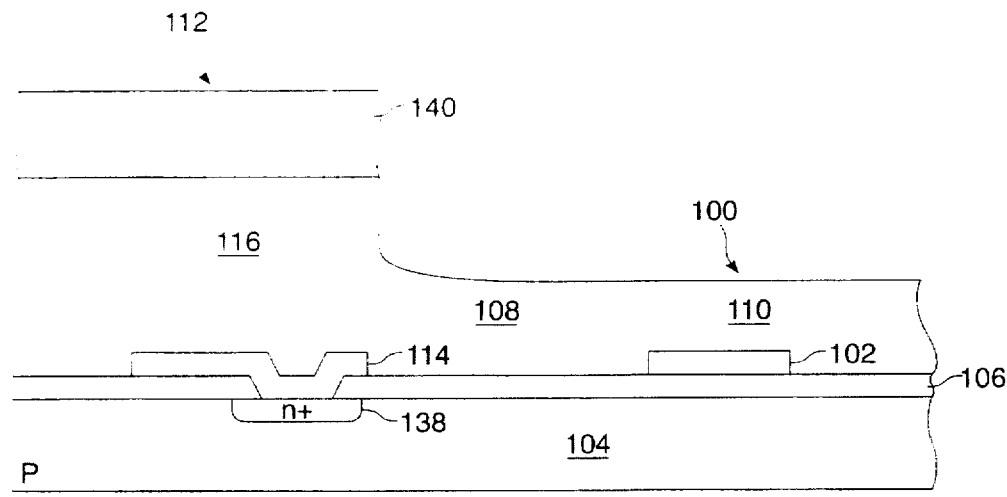

Referring now to FIG. 7b, a masking layer 140 is placed over portion 116 of inter-metal dielectric layer 108 in which the static-charge protection device 112 will be formed. An etching step is then performed to thin the portion 110 of inter-metal dielectric layer 108 in which antifuse 100 will be formed. In a typical process contemplated in accordance with the present invention, the thickness of portion 116 of inter-metal dielectric layer 108 may be about 1.1 microns and the thickness of portion 110 of inter-metal dielectric layer 108 may be about 0.8 microns.

Figure 7C:
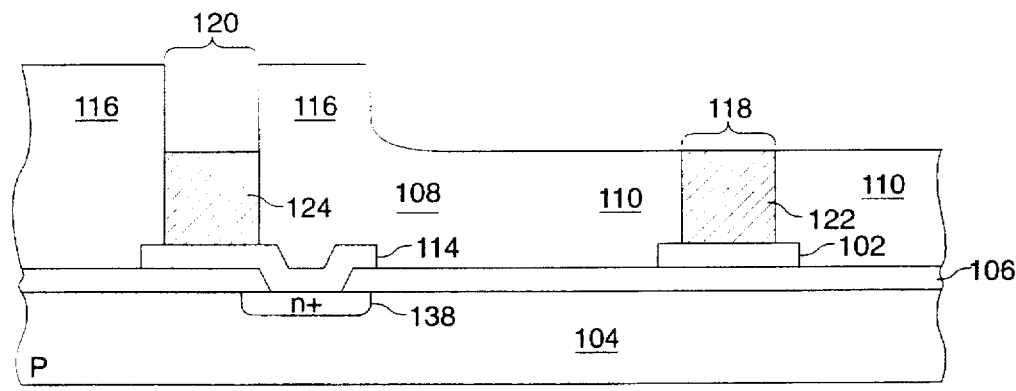

Referring to FIG. 7c, masking layer 140 has been removed and antifuse aperture 118 and static-charge protection device aperture 120 have been formed using conventional etching techniques. Via plugs 122 and 124 have been formed using selective plug fill technology. Those of ordinary skill in the art will note that, because of the greater depth of static-charge protection device aperture 120, via plug 124 does not completely fill the void formed thereby. This topographical feature will cause a weakened region of antifuse material layer 126 (shown in FIG. 7d) because of the necessary step coverage over this feature.

Figure 7D:
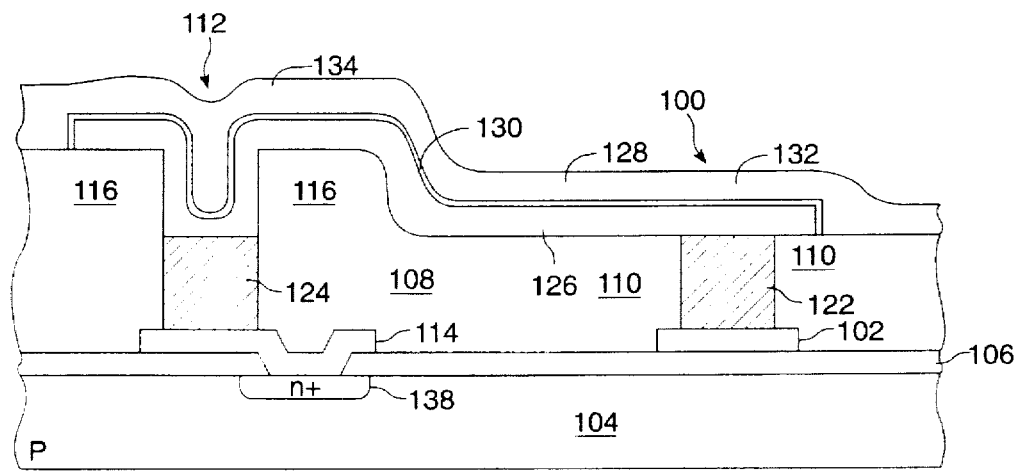

Referring now to FIG. 7d, the structure is shown after formation of antifuse material layer 126, barrier layer 130, and second metal layer 128 using conventional processing techniques. The structure depicted in FIG. 7d is essentially complete, and conventional steps, such as passivation and other back-end steps, may be performed to complete the device in which the depicted structure resides.

Figure 8:
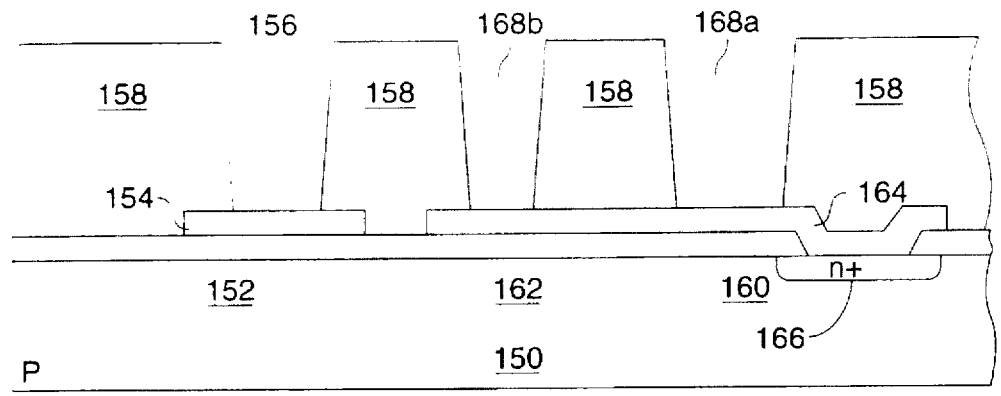
FIG. 8 is a cross-sectional view of a portion of a microcircuit structure including a metal-to-metal antifuse device and a pair of static charge protection devices according to a fifth embodiment of the present invention, which allows the use of the same masks regardless of whether a via plug process or a traditional sputter-into-via process is employed.

According to the present invention, provision may be made to employ the same mask set for forming the antifuses and static-charge protection devices regardless of whether plug processes such as those illustrated in FIGS. 5a–5d or traditional sputtering into via processes such as those illustrated in FIGS. 2a–2c are employed. According to this aspect of the present invention, which is illustrated in FIG. 8, a partially-completed antifuse structure is depicted along with two sites for potential static-charge protection devices. Thus, a partially-completed antifuse structure is shown in substrate 150 at region 152, and includes lower antifuse electrode 154 exposed at the bottom of antifuse aperture 156 formed in inter-metal dielectric layer 158 using conventional processing techniques.

Two potential static-charge protection devices are shown at regions 160 and 162 in substrate 150 after formation using conventional processing techniques. These structures are characterized by lower static-charge protection device electrode 164, communicating with doped region 166 in substrate 150. The structure in region 160 has been completed through formation of aperture 168a and the structure in region 162 has been completed through formation of aperture 168b. As may be seen from FIG. 8, aperture 168a is larger than antifuse aperture 156 and aperture 168b is smaller than antifuse aperture 156.

As those of ordinary skill in the art will appreciate, later performance of plug process steps on the structure of FIG. 8 will result in the formation of a static-charge protection device like that shown in FIG. 4 in region 160. Because of its smaller aperture 168b, no useful protection device will be formed in region 162. The device which is formed in region 162 will be merely a smaller antifuse which will not affect the operation of the circuit.

Conversely, if a sputter-into-via process is performed on the structure depicted in FIG. 8, a static-charge protection device like the one depicted in FIG. 1 will be formed in region 162. Because of its larger aperture 168a, no useful protection device will be formed in region 160. The device which is formed in region 160 will be merely a larger antifuse which will not affect the operation of the circuit.

Figure 9:
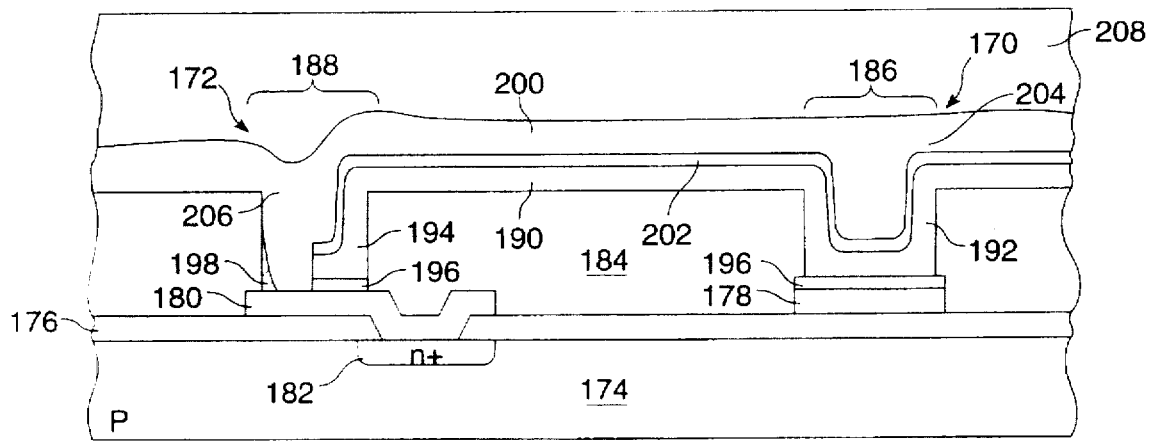
FIG. 9 is a cross-sectional view of a portion of a microcircuit structure including a metal-to-metal antifuse device and a static charge protection device according to a sixth embodiment of the present invention.

According to another aspect of the invention shown in FIG. 9, a static-charge protection device is fabricated as a short circuit. The short circuit provides a discharge path for charge accumulated in the microcircuit during fabrication. FIG. 9 is a cross sectional view of a microcircuit structure including an antifuse and a static charge protection device. In this embodiment, antifuse 170 and static charge protection device 172 are shown formed on a semiconductor substrate 174 with an intervening insulating layer 176. A lower antifuse electrode 178 and static charge protection device electrode 180 are defined from a first metal layer in the circuit structure. As in the embodiment depicted in FIG. 1 it will be appreciated by those of ordinary skill in the art that insulating layer 176 may be required because of the conductive or semiconductive nature of the underlying substrate 174 or as an adhesion promoting layer. In the embodiment shown in FIG. 9, the substrate 174 is a semiconductor and it will be appreciated by those skilled in the art that lower static-charge protection device electrode 180 contacts a doped region 182 in semiconductor substrate 174.

An inter-metal dielectric layer 184 with an antifuse aperture 186 and a static charge protection device aperture 188 formed therein is disposed over the substrate 174. An antifuse material layer 190 including first portion 192 formed in antifuse aperture 186 and second portion 194 formed in static-charge protection device aperture 188 is disposed over inter-metal dielectric layer 184. A lower barrier layer 196 is interposed between the lower antifuse electrode 178 and the lower static-charge protection device electrode 180 and the antifuse material layer 190. Also disposed within the static-charge protection device aperture 188 is a sidewall spacer 198 of antifuse material formed following the etch of the antifuse portion 194. Those of ordinary skill in the art will recognize that the existence of sidewall spacer 198 will depend upon several factors including the sizing of the aperture.

Finally, a second metal layer 200 with an intervening barrier layer 202 is disposed over antifuse material layer 190 and forms upper antifuse electrode 204 and upper static-charge protection device electrode 206. A passivation layer 208 is then formed over the entire surface of the microcircuit structure.

It can be seen in the embodiment shown in FIG. 9 that the second portion 194 of antifuse material layer 190 partially covers the lower static-charge protection device electrode 180. The portion of the lower static-charge protection device electrode 180 not covered by portion 194 of antifuse material layer 190 or the sidewall spacer 198 is in direct contact with upper static-charge protection device electrode portion 206 forming a short. The short provides protection to antifuse 170 by forming a discharge path for charge buildup on the upper metal layer 200. As in the embodiment shown in FIG. 1, the lower static-charge protection device electrode 180 contacts a doped region 182 which is reverse biased with respect to a semiconductor substrate 174 so as to isolate the static-charge protection device 172 during the normal operation of the circuit containing the antifuse 170.

As the embodiment in FIG. 1, inter-metal dielectric layer 184 may typically have a thickness of about between 0.7 to 1.0 microns. Antifuse aperture 186 and static-charge protection device aperture 188 are sized approximately the same, and in a typical embodiment may be between about 1.2 to 2.0 microns, and typically about 2.0 microns. Those of ordinary skill in the art will recognize that technical progress will predictably scale these parameters.

FIGS. 10a–10d are cross-sectional views of the microcircuit structure depicted in FIG. 9 shown after the completion of selected steps in the fabrication process and illustrate the process according to this embodiment of the invention.

Figure 10A:
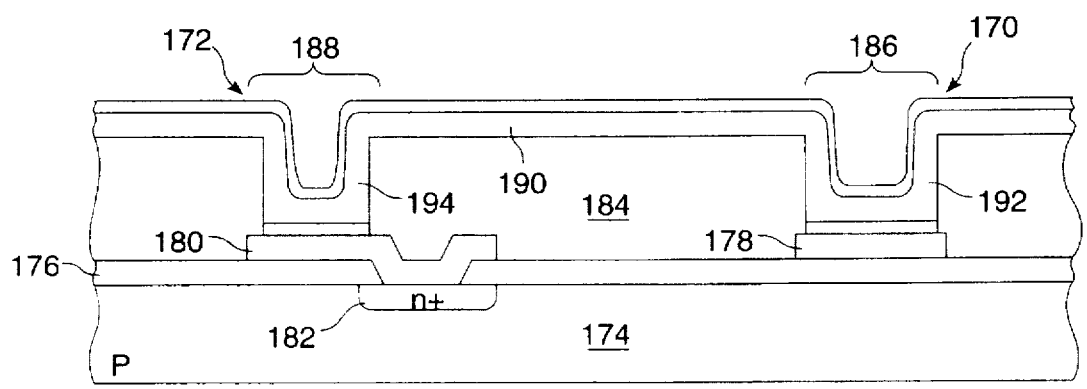
FIGS. 10a–10d are cross-sectional views of the microcircuit structure depicted in FIG. 9 shown after the completion of selected steps in the fabrication process.

Referring first to FIG. 10a, the microcircuit structure containing this embodiment of the present invention is seen following the formation of insulating layer 176 on the surface of substrate 174, the formation of doped region 182 in the substrate 174, and definition of the first metal layer into lower antifuse electrode 178 and lower static-charge protection device electrode 180. An inter-metal dielectric layer 184 has been deposited over the substrate 174 with antifuse aperture 186 and static, charge protection device aperture 188 formed therein. An antifuse fuse material layer 190 including first portion 192 formed in antifuse aperture 186 and second portion 194 formed in static-charge protection device aperture 188 is formed over inter-metal dielectric layer 184. Upper barrier layer 202 and lower barrier layer 196 are disposed above and below the antifuse material layer 190, respectively, as disclosed in the embodiment shown in FIG. 1. Those of ordinary skill in the art will recognize that the processing steps may be performed using conventional semiconductor processing technology.

Figure 10B:
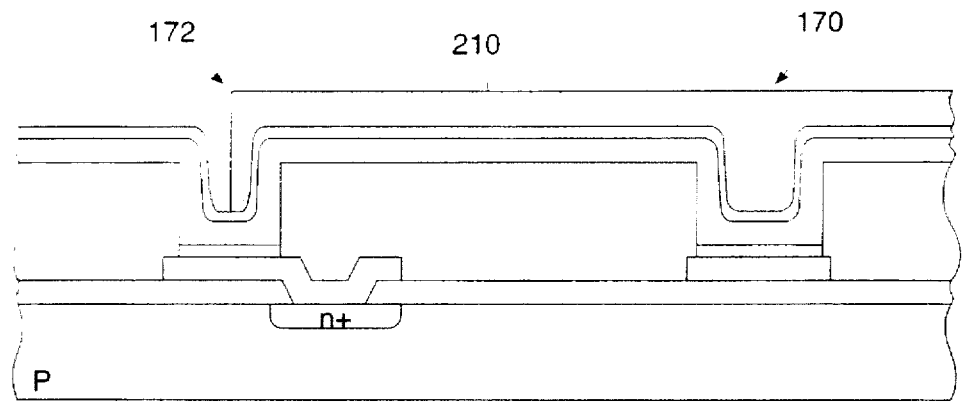

Referring now to FIG. 10b, the structure is shown with a mask 210 partially covering the static-charge protection device 172 and wholly covering the antifuse 170. Those of ordinary skill in the art know how to perform the processing steps necessary to form the masking step in FIG. 10b.

Figure 10C:
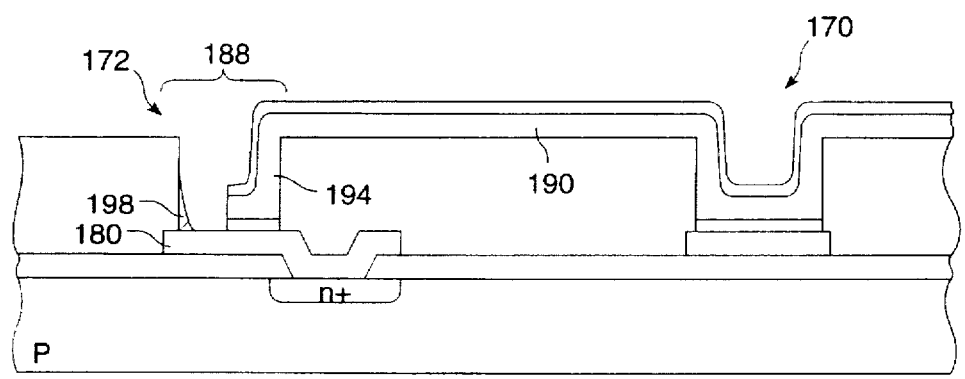

Referring now to FIG. 10c, the static-charge protection device 172 is formed following an etch step in which a part of second portion 194 of the antifuse material layer 190 is removed from static-charge protection device aperture 188 to expose a portion of lower static-charge protection device electrode 180. The microcircuit structure is depicted following the partial etchback of section portion 194 of the antifuse material from the static-charge protection device aperture 188 and the removal of the mask 210 (shown in FIG. 10b) using conventional processing techniques. As can be seen in FIG. 10c, a sidewall spacer 198 remains following the etchback, and the partial etchback of second portion 194 of the antifuse material layer 190 has exposed a portion of the lower static-charge protection device electrode 180.

Figure 10D:
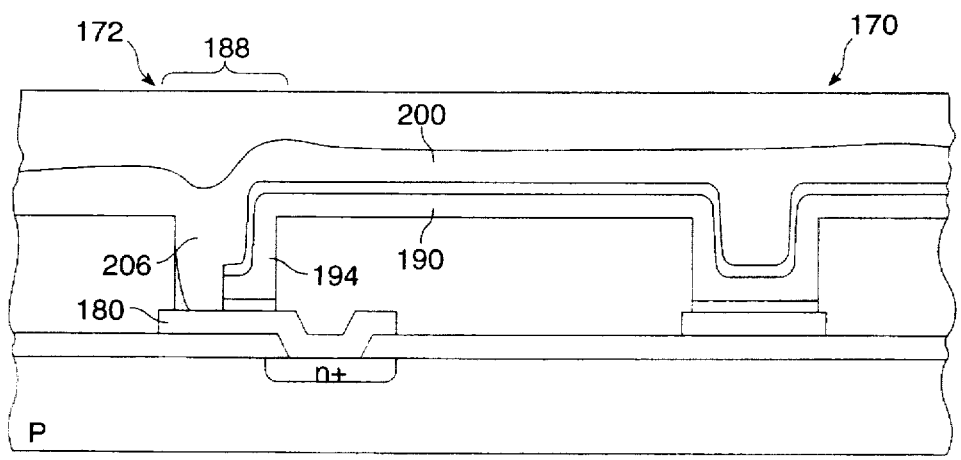

Referring now to FIG. 10d, a second metal layer 200 is shown disposed over the antifuse layer 190 and within the static-charge protection device aperture 188. It can be seen that the upper static-charge protection device electrode 206 of second metal layer 200 forms a contact with the lower static-charge protection device electrode 180 to provide a short serving as a discharge path for any static-charge buildup.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An antifuse structure including ESD protection comprising:
 a first antifuse structure including:
  a first electrode disposed over an insulating layer of an integrated circuit;
  an antifuse material layer having a first portion of a first thickness and a second portion of a second thickness: said first portion disposed over and in electrical contact with said first electrode;
  a second electrode disposed over and in electrical contact with said antifuse material layer; and
 a second antifuse structure including:
  a first ESD electrode in electrical contact with a semiconductor junction adapted to be biased so that said first ESD electrode of said second antifuse structure is selectively in electrical contact or insulated from said first electrode of said first antifuse structure;
  said second portion of said antifuse material layer of said second thickness less than said first thickness disposed on and in electrical contact with said first ESD electrode;
  a second ESD electrode disposed over and in electrical contact with said antifuse material layer, said second ESD electrode in electrical contact with said second electrode.

2. An antifuse structure including ESD protection comprising:
 a first antifuse structure including:
  a first electrode disposed over an insulating layer of an integrated circuit;
  an interlayer dielectric layer disposed over said first electrode and having a first cell opening of a first width penetrating entirely through said interlayer dielectric layer to provide access to said first electrode;
  an antifuse material layer having a first portion of a first thickness and a second portion of a second thickness; said first portion disposed over and in electrical contact with said first electrode and in said first cell opening;
  a second electrode disposed over and in electrical contact with said antifuse material layer; and
 a second antifuse structure including:
  a first ESD electrode in electrical contact with a semiconductor junction adapted to be biased so that said first ESD electrode of said second antifuse structure is selectively in electrical contact or insulated from said first electrode of said first antifuse structure;
  said interlayer dielectric layer disposed over said first ESD electrode and having a second cell opening of a second width less than said first width penetrating entirely through said interlayer dielectric layer to provide access to said first ESD electrode;
  said second portion of said antifuse material layer of said second thickness less than said first thickness disposed on and in electrical contact with said first ESD electrode and in said second cell opening;
  a second ESD electrode disposed over and in electrical contact with said antifuse material layer, said second ESD electrode in electrical contact with said second electrode.

3. An antifuse structure including ESD protection comprising:
 a first antifuse structure including:
  a first electrode disposed over an insulating layer of an integrated circuit;
  an interlayer dielectric layer disposed over said first electrode;
  a first cell opening in said interlayer dielectric layer penetrating entirely through said interlayer dielectric layer to provide access to said first electrode;
  a conductive material deposited within and filling said first cell opening so that said conductive material is in electrical contact with said first electrode;
  an antifuse material layer having a first portion of a first thickness and a second portion of a second thickness; said first portion disposed over and in electrical contact with said conductive material;
  a second electrode disposed over and in electrical contact with said antifuse material layer; and
 a second antifuse structure including:
  a first ESD electrode in electrical contact with a semiconductor junction adapted to be biased so that said first ESD electrode of said second antifuse structure is selectively in electrical contact or insulated from said first electrode of said first antifuse structure;
  said second portion of said antifuse material layer of said second thickness less than said first thickness disposed on and in electrical contact with said first ESD electrode;
  a second ESD electrode disposed over and in electrical contact with said antifuse material layer, said second ESD electrode in electrical contact with said second electrode.

4. An antifuse structure including ESD protection comprising:
 a first antifuse structure including:
  a first electrode disposed over an insulating layer of an integrated circuit;
  an interlayer dielectric layer disposed over said first electrode;
  a first cell opening in said interlayer dielectric layer penetrating entirely through said interlayer dielectric layer to provide access to said first electrode;
  a conductive material deposited within and filling said first cell opening so that said conductive material is in electrical contact with said first electrode;
  an antifuse material layer having a first portion of a first thickness and a second portion of a second thickness; said first portion disposed over and in electrical contact with said conductive material;
  a second electrode disposed over and in electrical contact with said antifuse material layer; and
 a second antifuse structure including:
  a first ESD electrode in electrical contact with a semiconductor junction adapted to be biased so that said first ESD electrode of said second antifuse structure is selectively in electrical contact or insulated from said first electrode of said first antifuse structure;
  said interlayer dielectric layer disposed over said first ESD electrode;
  a second cell opening in said interlayer dielectric layer penetrating entirely through said interlayer dielectric layer to provide access to said first ESD electrode;
  said antifuse material layer of said second thickness less than said first thickness disposed on and in electrical contact with said first ESD electrode and in said cell opening;
  a second ESD electrode disposed over and in electrical contact with said antifuse material layer, said second ESD electrode in electrical contact with said second electrode.

5. An antifuse structure including ESD protection comprising:

a first antifuse structure including:
- a first electrode disposed over an insulating layer of an integrated circuit;
- an interlayer dielectric layer disposed over said first electrode;
- a first cell opening in said interlayer dielectric layer penetrating entirely through said interlayer dielectric layer to provide access to said first electrode;
- a conductive material deposited within and filling said first cell opening so that said conductive material is in electrical contact with said first electrode;
- an antifuse material layer having a first portion of a first minimum thickness and a second portion of a second minimum thickness: said first portion within a first region defined by said first cell opening disposed over and in electrical contact with said conductive material;
- a second electrode disposed over and in electrical contact with said antifuse material layer; and a second antifuse structure including:
- a first ESD electrode in electrical contact with a semiconductor junction adapted to be biased so that said first ESD electrode of said second antifuse structure is selectively in electrical contact or insulated from said first electrode of said first antifuse structure;
- said interlayer dielectric layer disposed over said first ESD electrode;
- a second cell opening in said interlayer dielectric layer penetrating entirely through said interlayer dielectric layer to provide access to said first ESD electrode;
- a conductive material deposited within and filling said second cell opening so that said conductive material is in electrical contact with said first ESD electrode;
- said second portion of said antifuse material layer having said second minimum thickness within a second region defined by said second cell opening, said second thickness being less than said first thickness, said antifuse material layer disposed over and in electrical contact with said conductive material;
- a second ESD electrode disposed over and in electrical contact with said antifuse material layer, said second ESD electrode in electrical contact with said second electrode.

6. An antifuse structure including ESD protection comprising:
- an antifuse electrode disposed over an insulating layer of an integrated circuit;
- an ESD protection electrode disposed over said insulating layer in said integrated circuit;
- an interlayer dielectric layer disposed over said antifuse electrode and said ESD protection electrode, said interdielectric layer having a first sized aperture formed therein and penetrating entirely through said interlayer dielectric layer to said antifuse electrode and a second sized aperture smaller than said first sized aperture formed therein and penetrating entirely through said interlayer dielectric layer to said ESD protection device electrode;
- an antifuse material layer disposed in said first and second sized apertures and in electrical contact with said antifuse and said ESD protection device electrodes;
- an antifuse and ESD protection device electrode disposed over and in electrical contact with said antifuse material layer.

7. An antifuse structure including ESD protection comprising:
- an antifuse electrode disposed over an insulating layer of an integrated circuit;
- an ESD protection electrode disposed over said insulating layer in said integrated circuit;
- an interlayer dielectric layer disposed over said antifuse electrode and said ESD protection electrode, said interdielectric layer having a first sized aperture formed therein and penetrating entirely through said interlayer dielectric layer to said antifuse electrode and a second sized aperture larger than said first sized aperture formed therein and penetrating entirely through said interlayer dielectric layer to said ESD protection device electrode;
- a conductive material disposed in and filling said first sized aperture and in electrical contact with said antifuse electrode;
- an antifuse material layer disposed in said first and second sized apertures and in electrical contact with said conductive material and said ESD protection device electrodes; and
- an antifuse and ESD protection device electrode disposed over and in electrical contact with said antifuse material layer.

8. An antifuse structure including ESD protection comprising:
- an antifuse electrode disposed over an insulating layer of an integrated circuit;
- an ESD protection electrode disposed over said insulating layer in said integrated circuit;
- an interlayer dielectric layer having a first portion with a first thickness disposed over said antifuse electrode and a second portion with a second thickness greater than said first portion disposed over said ESD protection electrode, said interdielectric layer having a first aperture formed therein and penetrating entirely through said interlayer dielectric layer to said antifuse electrode, and a second aperture formed therein and penetrating entirely through said interlayer dielectric layer to said ESD protection device electrode;
- a conductive material disposed in and filling said first aperture and in electrical contact with said antifuse electrode and disposed in and at least partially filling said second aperture and in electrical contact with said ESD electrode;
- an antifuse material layer disposed over and in electrical contact with said conductive material; and
- an upper antifuse and ESD protection device electrode disposed over and in electrical contact with said antifuse material layer.

* * * * *

UNITED STATES PATENT AND TRADEMARK OFFICE
CERTIFICATE OF CORRECTION

PATENT NO. : 5,519,248
DATED : May 21, 1996
INVENTOR(S) : Yeouchung Yen; Wenn Chen; Steve Chiang; Rahim Forouhi It is certified that error appears in the above-indentified patent and that said Letters Patent is hereby corrected as shown below:

<u>Title Page</u>:

items [19] & [54] "Inventors", replace "Yan" with --Yen--.

On Column 2, line 19, replace "antirinse" with --antifuse--.

On Column 8, line 31, after "electrode" insert --36--.

On Column 8, line 40, replace "protective" with --protection--.

On Column 8, line 46, after "lower" insert --static charge proection device--.

On Column 9, line 51, after "material" insert --layer 74 in region 78--.

On Column 9, line 55, delete the "a" before "static-charge".

On Column 14, line 46, replace "section" with --second--.

On Column 14, line 47, after "material" insert --layer 190--.

Signed and Sealed this

Tenth Day of December, 199

Attest:

BRUCE LEHMAN

*Attesting Officer*  *Commissioner of Patents and Trademarks*